US011322823B2

(12) United States Patent
Chiu et al.

(10) Patent No.: US 11,322,823 B2
(45) Date of Patent: May 3, 2022

(54) ANTENNA-IN-PACKAGE WITH FREQUENCY-SELECTIVE SURFACE STRUCTURE

(71) Applicant: MEDIATEK INC., Hsin-Chu (TW)

(72) Inventors: Shih-Chia Chiu, Hsin-Chu (TW); Yen-Ju Lu, Hsin-Chu (TW); Wen-Chou Wu, Hsin-Chu (TW); Nan-Cheng Chen, Hsin-Chu (TW)

(73) Assignee: MediaTek Inc., Hsin-Chu (TW)

( * ) Notice: Subject to any disclaimer, the term of this patent is extended or adjusted under 35 U.S.C. 154(b) by 424 days.

(21) Appl. No.: 16/120,446

(22) Filed: Sep. 3, 2018

(65) Prior Publication Data

US 2019/0115646 A1 Apr. 18, 2019

Related U.S. Application Data

(60) Provisional application No. 62/589,611, filed on Nov. 22, 2017, provisional application No. 62/573,713, (Continued)

(51) Int. Cl.
*H01Q 1/22* (2006.01)
*H01L 23/66* (2006.01)
(Continued)

(52) U.S. Cl.
CPC ......... *H01Q 1/2283* (2013.01); *H01L 23/145* (2013.01); *H01L 23/3114* (2013.01);
(Continued)

(58) Field of Classification Search
CPC ....... H01Q 1/2283; H01Q 15/00–0093; H01Q 15/10; H01Q 19/06; H01Q 1/22
See application file for complete search history.

(56) References Cited

U.S. PATENT DOCUMENTS 10,186,492 B1* 1/2019 Wan .................. H01L 23/481
10,700,410 B2* 6/2020 Lu .................... H01L 23/66
(Continued)

FOREIGN PATENT DOCUMENTS

CN 106575815 A 4/2017
CN 106961001 A 7/2017
(Continued)

OTHER PUBLICATIONS

Written Opinion from the European Patent Office, dated Mar. 14, 2019. (Year: 2019).*
(Continued)

*Primary Examiner* — Dameon E Levi
*Assistant Examiner* — Jennifer F Hu
(74) *Attorney, Agent, or Firm* — Wolf, Greenfield & Sacks, P.C.

(57) ABSTRACT

A semiconductor package includes a substrate having thereon at least an antenna layer and a ground reflector layer under the antenna layer, a radio frequency (RF) die disposed on or in the substrate, an encapsulation layer disposed on the antenna layer of the substrate, and a frequency-selective surface (FSS) structure disposed on the encapsulation layer. The FSS structure is a two-dimensional periodic array of metal patterns of same shape and size. The FSS structure has highly reflective characteristic.

20 Claims, 13 Drawing Sheets

Related U.S. Application Data filed on Oct. 18, 2017, provisional application No. 62/573,182, filed on Oct. 17, 2017.

(51) Int. Cl.
| | |
|---|---|
| *H01L 23/31* | (2006.01) |
| *H01Q 21/06* | (2006.01) |
| *H01L 23/14* | (2006.01) |
| *H01Q 15/00* | (2006.01) |
| *H01Q 19/06* | (2006.01) |
| *H01Q 15/10* | (2006.01) |

(52) U.S. Cl.
CPC .......... *H01L 23/3128* (2013.01); *H01L 23/66* (2013.01); *H01Q 15/0013* (2013.01); *H01Q 15/10* (2013.01); *H01Q 19/062* (2013.01); *H01Q 21/065* (2013.01); *H01L 2223/6677* (2013.01); *H01L 2224/02379* (2013.01); *H01L 2224/02381* (2013.01)

(56) References Cited

U.S. PATENT DOCUMENTS

| | | | |
|---|---|---|---|
| 2008/0001843 A1* | 1/2008 | Wu | H01Q 1/405 343/873 |
| 2009/0042336 A1* | 2/2009 | Paik | H01L 21/4857 438/107 |
| 2013/0141284 A1* | 6/2013 | Jeong | H01Q 1/2283 343/700 MS |
| 2014/0210687 A1* | 7/2014 | Chiu | H01Q 1/2283 343/872 |
| 2015/0070228 A1 | 3/2015 | Gu | |
| 2017/0155185 A1* | 6/2017 | Hong | H01Q 15/02 |
| 2017/0179570 A1 | 6/2017 | Charvat | |
| 2018/0205134 A1* | 7/2018 | Khan | H01Q 5/314 |
| 2019/0096828 A1* | 3/2019 | Wu | H01L 21/565 |

FOREIGN PATENT DOCUMENTS

| | | | |
|---|---|---|---|
| EP | 3 364 457 A1 | 8/2018 | |
| EP | 3474370 A1 * | 4/2019 | ......... H01L 23/3128 |
| EP | 3474370 B1 * | 9/2021 | ............ H01Q 15/10 |
| FR | 3 030 903 | 6/2016 | |
| FR | 3030903 A1 | 6/2016 | |
| TW | 201345047 A | 11/2013 | |

OTHER PUBLICATIONS

Decision to Grant European Patent for EP 18198837.9, dated Aug. 19, 2021. (Year: 2021).*

English Translation of the Third Office Action by the State Intellectual Property Office of People's Republic of China, dated Aug. 25, 2021. (Year: 2021).*

English Translation of the Second Office Action by the State Intellectual Property Office of People's Republic of China, dated Feb. 24, 2021. (Year: 2021).*

English Translation of First Office Action by the State Intellectual Property Office of People's Republic of China, dated Oct. 16, 2018. (Year: 2018).*

* cited by examiner

ANTENNA-IN-PACKAGE WITH FREQUENCY-SELECTIVE SURFACE STRUCTURE

CROSS REFERENCE TO RELATED APPLICATIONS

This application claims priority from U.S. provisional application No. 62/573,182 filed Oct. 17, 2017, U.S. provisional application No. 62/573,713 filed Oct. 18, 2017, and U.S. provisional application No. 62/589,611 filed Nov. 22, 2017, the subject matter of which is hereby incorporated by reference.

BACKGROUND

This disclosure relates generally to the field of semiconductor packaging and, more particularly, to an Antenna-in-Package (AiP) with a frequency-selective surface (FSS) structure.

The demand for low-cost, high performance, compact radar systems for millimeter wave (mm-wave) applications has risen in the past few years. As a result, the development of Antenna-in Packages (AiP) has become more important.

As known in the art, the design of an AiP has been focused on how to achieve high-gain and well-controlled radiation pattern. However, it is difficult to maintain antenna performances while fitting in packages that are becoming increasingly smaller and slimmer.

The prior art high-gain antenna design usually needs multiple radiation elements to form the antenna array and requires complicated feeding network for transmitted/received RF signal handling. Further, the prior design of high-gain antenna needs large antenna placement area (large footprint).

There is a need in this industry to provide an improved AiP with high-gain antenna that does not require complex feeding network and does not occupy large antenna placement area.

SUMMARY

One object of the present invention is to provide an improved semiconductor package to overcome the deficiencies and disadvantages of the prior art.

One embodiment of the present disclosure provides a semiconductor package including a substrate having thereon at least an antenna layer and a ground reflector layer under the antenna layer, a radio frequency (RF) die disposed on or in the substrate, an encapsulation layer disposed on the antenna layer of the substrate, and a frequency-selective surface (FSS) structure disposed on the encapsulation layer.

According to one embodiment of the invention, the antenna layer is electrically connected to the RF die.

According to one embodiment of the invention, the FSS structure comprises a two-dimensional periodic array of metal patterns of same shape and size.

According to one embodiment of the invention, the two-dimensional periodic array of metal patterns has a fixed pitch.

According to one embodiment of the invention, the FSS structure is disposed directly above and is aligned with the antenna layer.

According to one embodiment of the invention, the FSS structure is disposed directly on a top surface of the encapsulation layer.

According to one embodiment of the invention, the ground reflector layer is a metal layer.

According to one embodiment of the invention, the semiconductor package is a fan-out wafer level package (FOWLP) and the substrate is a re-distribution layer (RDL) substrate.

According to one embodiment of the invention, the semiconductor package is a flip-chip chip scale package (FCCSP) and the substrate is a packaging substrate.

According to one embodiment of the invention, the semiconductor package is an embedded die package and the substrate is an organic laminate substrate. The RF die is embedded in the organic laminate substrate.

According to one embodiment of the invention, the semiconductor package further includes a plurality of solder balls disposed on a bottom surface of the substrate.

According to one embodiment of the invention, the semiconductor package further includes a plurality of supporting pillars between the FSS structure and the substrate. The plurality of supporting pillars surrounds the antenna layer and the FSS structure These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The terms "die", "chip", "semiconductor chip", and "semiconductor die" may be used interchangeable throughout the specification to mean integrated circuit chip or die. The term "horizontal" as used herein may be defined as a direction parallel to a plane or surface (e.g., a surface of a substrate), regardless of its orientation. The term "vertical," as used herein, may refer to a direction orthogonal to the horizontal direction as just described. Terms, such as "on," "above," "below," "bottom," "top," "side" (as in "sidewall"), "higher," "lower," "upper," "over," and "under," may be referenced with respect to the horizontal plane.

Figure 1:
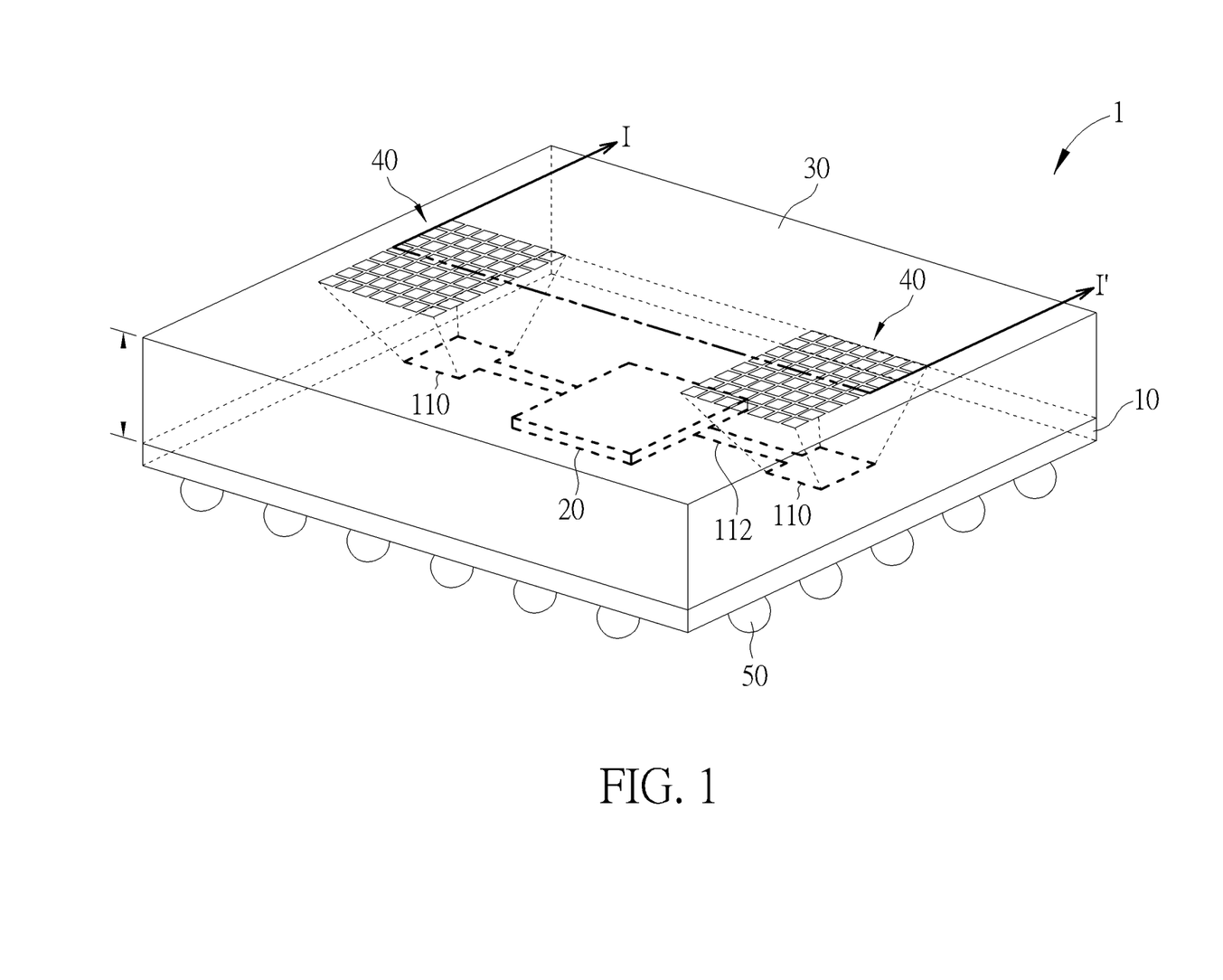
FIG. 1 is a schematic, perspective view of an Antenna-in-Package (AiP) with a frequency-selective surface (FSS) structure according to one embodiment of the invention.
Figure 2:
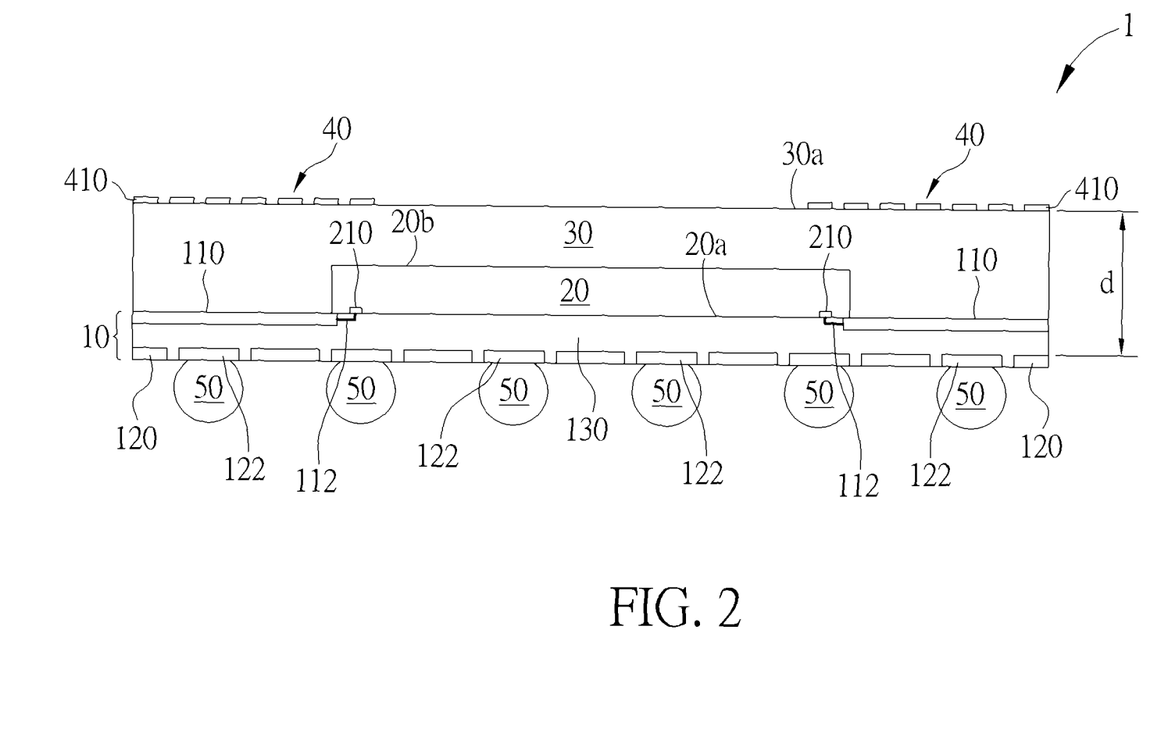
FIG. 2 is a schematic, cross-sectional view taken along line I-I' in FIG. 1.
Figure 3:
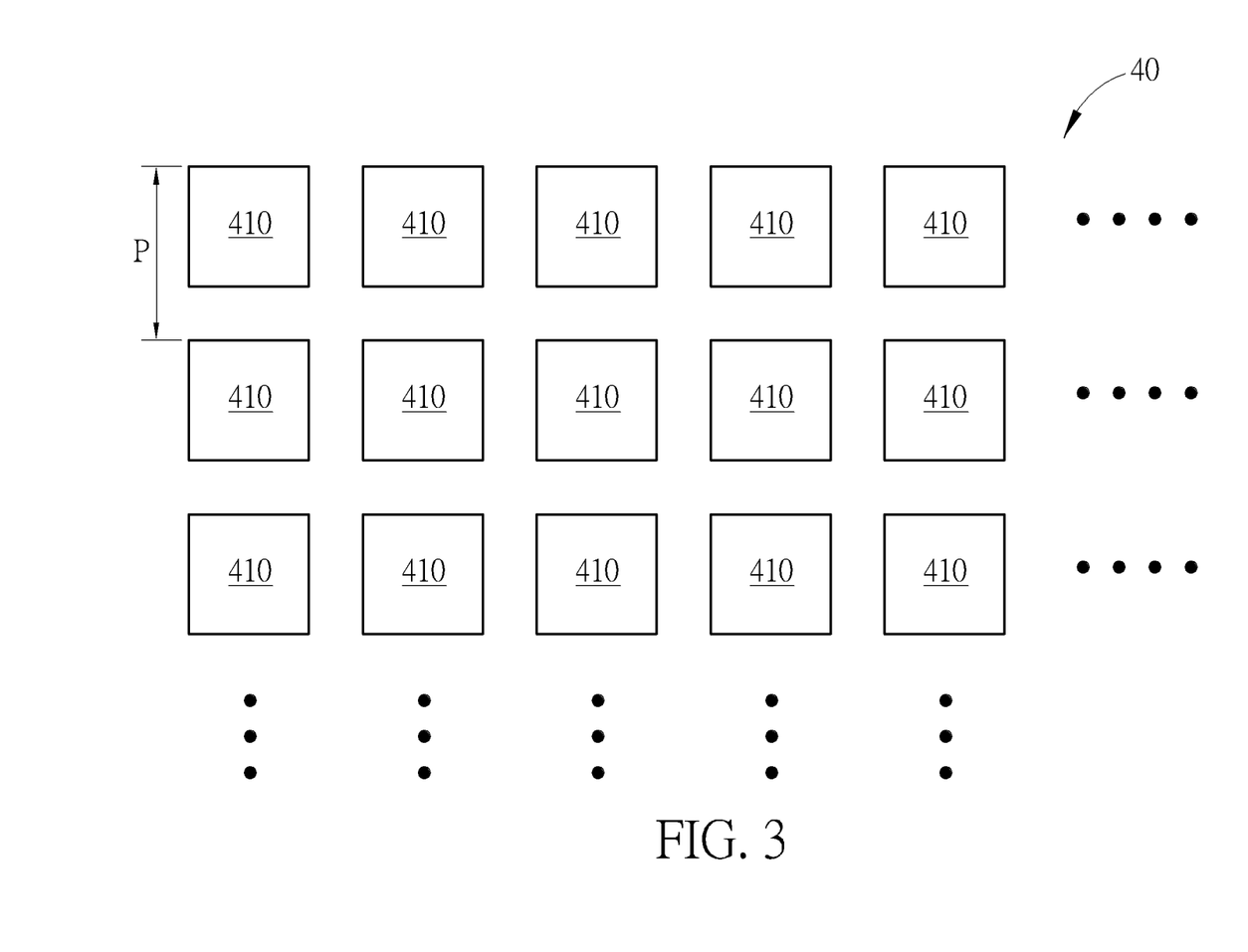
FIG. 3 is a schematic top view of an exemplary FSS structure according to one embodiment of the invention.

Please refer to FIG. 1 to FIG. 3. FIG. 1 is a schematic, perspective view of an Antenna-in-Package (AiP) with a frequency-selective surface (FSS) structure according to one embodiment of the invention. FIG. 2 is a schematic, cross-sectional view taken along line I-I' in FIG. 1. FIG. 3 is a schematic top view of an exemplary FSS structure according to one embodiment of the invention. Some detailed structures are not shown in the figures as they would be appreciated by a person skilled in the pertinent art.

As shown in FIG. 1 and FIG. 2, a semiconductor package 1 is provided. According to one embodiment of the invention, the semiconductor package 1 may be an Antenna-in-Package (AiP) with a frequency-selective surface (FSS) structure. According to one embodiment of the invention, the semiconductor package 1 may comprise a substrate 10, a radio frequency (RF) die 20 disposed on the substrate 10, an encapsulation layer 30 that is disposed on the substrate 10 and encapsulates the RF die 20, a frequency-selective surface (FSS) structure 40 disposed on the encapsulation layer 30, and a plurality of solder balls 50 disposed on a bottom surface of the substrate 10.

According to one embodiment of the invention, the substrate 10 may comprise at least an antenna layer 110, a ground reflector layer 120 under the antenna layer 110, and an insulating layer 130 between the antenna layer 110 and the ground reflector layer 120. The substrate 10 may further comprise a plurality of ball pads 122 for attaching the solder balls 50. According to one embodiment of the invention, the ball pads 122 and the ground reflector layer 120 are coplanar and are formed in the same metal layer of the substrate 10.

According to one embodiment of the invention, the antenna layer 110 and the ground reflector layer 120 are formed in two different metal layers (e.g., copper layers). The two metal layers are in different horizontal planes. For example, the substrate 10 may have an upper surface that is adjacent to the RF die 20 and a lower surface opposite to the upper surface. The antenna layer 110 may be formed on the upper surface and may be electrically connected to the RF die 20 through an interconnect or a trace 112. The ground reflector layer 120, which may be electrically connected to a ground plane, may be formed on the lower surface. Although not shown in the figures, it is to be understood that the metal layers in the substrate 10 may be interconnected through conductive vias if necessary.

According to one embodiment of the invention, the antenna layer 110 may be a patch antenna, but is not limited thereto. For example, the antenna layer 110 may have a rectangular shape and may have a dimension of about $(\lambda_g/2) \times (\lambda_g/2)$, wherein $\lambda_g$ is the guided wavelength of the electromagnetic radiation transmitted via the antenna layer 110, for example, a W-band radar, operating at 77 GHz, would have a $\lambda_g = 1.1 \sim 1.3$ mm, wherein the substrate dielectric constant ($\varepsilon_r$) is about 3.6.

It is to be understood that the antenna can be realized by any type of antenna structure. In the illustrated embodiment of this disclosure, a patch antenna is selected due to its high gain and broadside radiation characteristics. According to other embodiments of the invention, the antenna layer 110 may be a phased-array antenna, a dipole antenna, a slot antenna, etc. According to one embodiment of the invention, the ground reflector layer 120 may be a solid metal layer such as a solid copper layer, which completely overlaps with the antenna layer 110 when viewed from the above.

According to one embodiment of the invention, the RF die 20 may be an integrated circuit (IC) silicon die or a semiconductor chip that comprises relative functional circuits for transmitting and/or receiving RF signals. According to one embodiment of the invention, the RF die 20 may have an active surface 20a and a passive surface 20b that is opposite to the active surface 20a. A plurality of input/output (I/O) pads 210 may be disposed on the active surface 10a. According to one embodiment of the invention, the active surface 10a of the RF die 20 may be integrally joined with the upper surface of the substrate 10. The antenna layer 110 may be electrically connected to respective I/O pads 210 on the active surface 20a of the RF die 20 through the interconnect or the trace 122.

According to one embodiment of the invention, the encapsulation layer 30 may comprise molding compound, substrate materials or LTCC (low-temperature co-fired ceramic) materials. The encapsulation layer 30 may comprise organic resin typically used in the encapsulation of integrated circuit devices and selected for low moisture permeability and low thermal coefficient of expansion to avoid exposure of the encapsulated chip to moisture or mechanical stress, respectively. For example, according to one embodiment of the invention, the encapsulation layer 30 may comprise epoxy materials.

The encapsulation layer 30 may further comprise fillers, such as amorphous silicon oxide (silica glass) and crystalline silicon oxide (quartz) fillers. Suitable additives may be added to enhance the thermal conductivity of the encapsulation layer 30. According to one embodiment of the invention, the encapsulation layer 30 may have a dielectric constant k ranging between 3.3 and 3.4, for example. According to one embodiment of the invention, the encapsulation layer 30 may have a thickness of about 1.1~1.3 mm, for example, 1.2 mm. The distance d between FSS structure 40 and the ground reflector layer 120 is about $\lambda_g/2$.

According to one embodiment of the invention, as can be best seen in FIG. 1 and FIG. 3, the FSS structure 40 is a two-dimensional periodic array of metal patterns 410 of same shape and size. The FSS structure 40 has highly reflective characteristic. According to one embodiment of the invention, the FSS structure 40 is disposed directly on a top surface 30a of the encapsulation layer 30 and may be formed by techniques including, but not limited to, screen printing, 3D printing, coating, plating, laser, lithography or etching. The FSS structure 40 may be a re-distribution layer in some embodiments.

According to one embodiment of the invention, the FSS structure 40 is disposed directly above and is aligned with the antenna layer 110. According to one embodiment of the invention, the FSS structure 40 is formed only within a predetermined, coextensive area situated directly above the antenna layer 110, and the rest portion of the top surface 30a of the encapsulation layer 30 is not covered with the FSS structure 40 thereby achieving a broader bandwidth, however, shape or allocation of the FSS in other embodiments may not be restricted.

According to one embodiment of the invention, the two-dimensional periodic array of metal patterns 410 may have a fixed pitch P. According to one embodiment of the invention, the fixed pitch P may be λ/8. According to one embodiment of the invention, the coextensive FSS structure 40 may have a dimension of about λ×λ (for a rectangular shaped FSS structure 40, each side of which has a width of λ/4+λ/2+λ/4=λ), however, pitch of the FSS in other embodiments may also not be restricted.

It is to be understood that the unit cells (metal patterns 410) of the periodic FSS structure can be realized by any type and any shape (e.g., grid type, cross type, square type, circular type, trident type, etc.) according to the design purpose. In this disclosure, a capacitive patch type unit cell is selected due to its characteristic of negative reflection phase, which can reduce the distance between the ground reflector layer 120 and the FSS structure 40, thereby achieving an AiP with low profile.

According to one embodiment of the invention, the semiconductor package 1 may be a fan-out wafer level package (FOWLP) and the substrate 10 may be a re-distribution layer (RDL) substrate. As known in the art, wafer level package (WLP) involves packaging the die while it is still on the wafer. Generally, WLP is a substrate-less package. Instead of a substrate, WLP utilizes a thin-film of routing layers, or redistribution layers (RDLs), which provide electrical connections in the package. WLP makes use of solder balls 50 on the bottom of the package, which connects the RDLs to a board or a printed circuit board (PCB).

According to another embodiment of the invention, the semiconductor package 1 may be a flip-chip chip scale package (FCCSP) and the substrate 10 may be a packaging substrate such as a circuit board or wiring board formed by semi-additive processes. To attach the flip chip onto the circuit board, the RF die 20 is inverted to bring the soldered bumps or pillars (not shown) on the active surface 20a down onto connectors or pads on the underlying circuit board. The solder is then re-melted to produce an electrical connection, typically using a reflow solder process.

In most cases, an electrically-insulating adhesive is then "underfilled" to provide a stronger mechanical connection, provide a heat bridge, and to ensure the solder joints are not stressed due to differential heating of the chip and the rest of the system. The underfill distributes the thermal expansion mismatch between the chip and the board, preventing stress concentration in the solder joints which would lead to premature failure.

Figure 4:
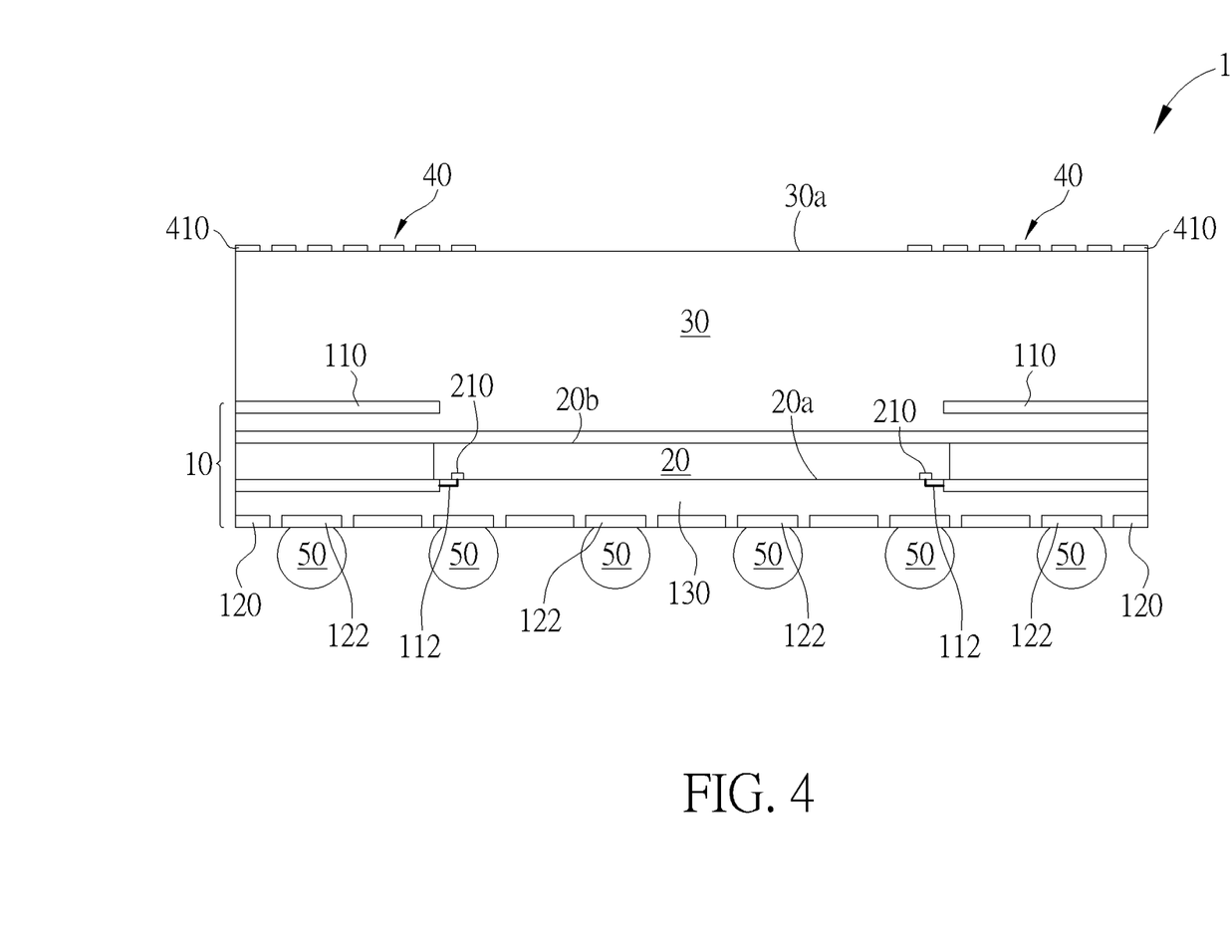
FIG. 4 shows a variation of an AiP with an FSS structure and an embedded RF die in a SESUB substrate according to another embodiment of the invention.

According to still another embodiment of the invention, as shown in FIG. 4, the semiconductor package 1 may be an embedded die package and the substrate 10 may be an organic laminate substrate such as SESUB (Semiconductor Embedded in SUBstrate), which is a technology that embeds the IC silicon die in the laminated substrate. This SESUB substrate with the thinned IC silicon die embedded can be mounted with various electronic components to form a highly integrated, multiple function module/package. The RF die 20 may be embedded in the core of the substrate 10. This core may be made of special resin. Besides the core resin, the other substrate layers are standard PCB material.

The present invention provides an improved AiP with a source antenna incorporated with a gain-enhancement FSS structure as superstrate. The FSS structure is a frequency-dependent periodic structure with special electromagnetic characteristic. Therefore, no complex feeding networks is needed, which leads to easier tuning of the operating frequency to fit the design goal.

Figure 5:
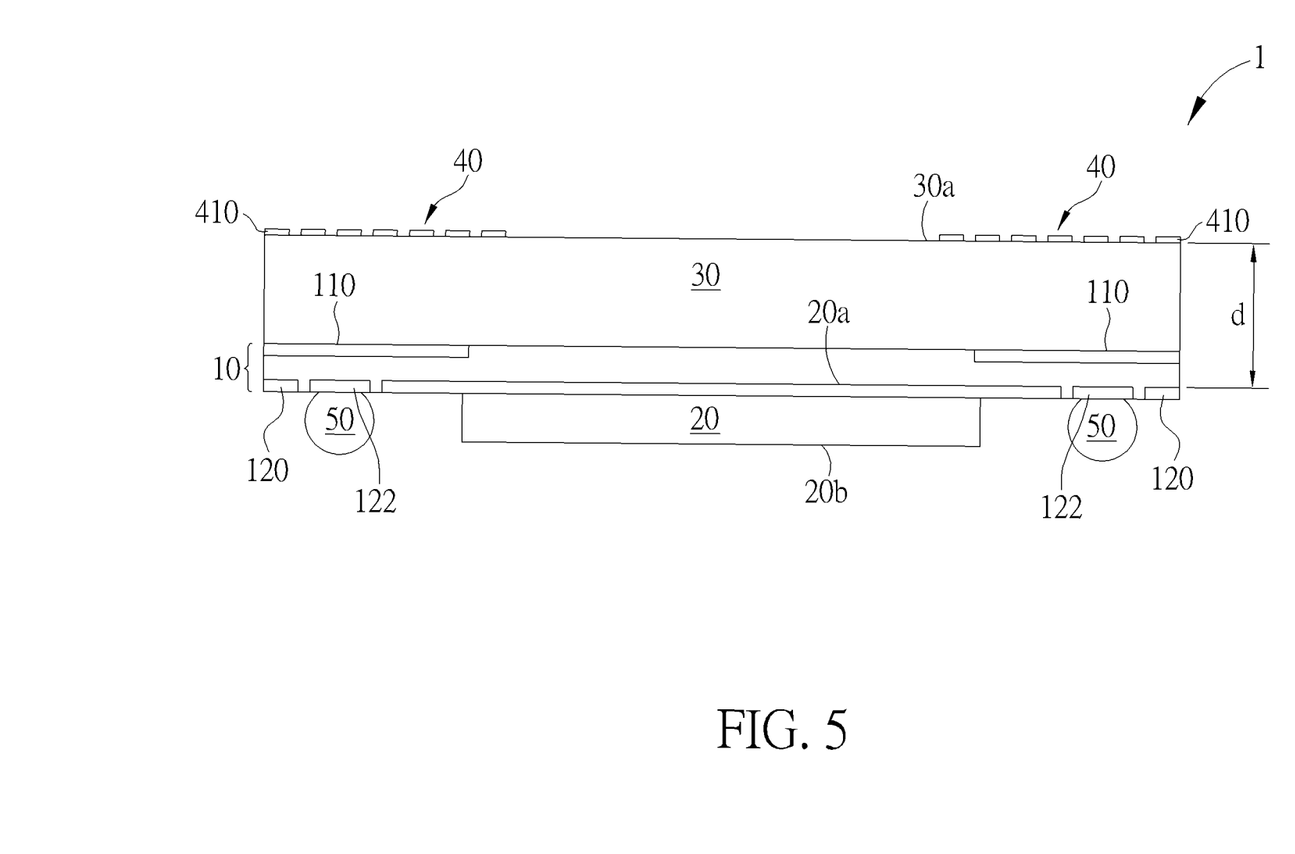
FIG. 5 shows a variation of an AiP with an FSS structure according to another embodiment of the invention.

FIG. 5 shows a variation of an AiP with an FSS structure according to another embodiment of the invention, wherein like numeral numbers designate like elements, regions or layers. As shown in FIG. 5, the RF die 20 is mounted on the bottom surface of the substrate 10. The RF die 20 may be mounted on the bottom surface of the substrate 10 by using conventional flip-chip processes, but not limited thereto. By disposing the RF die 20 on the bottom surface of the substrate 10, the interference between the RF die 20 and the antenna layer 110 may be reduced.

Figure 6:
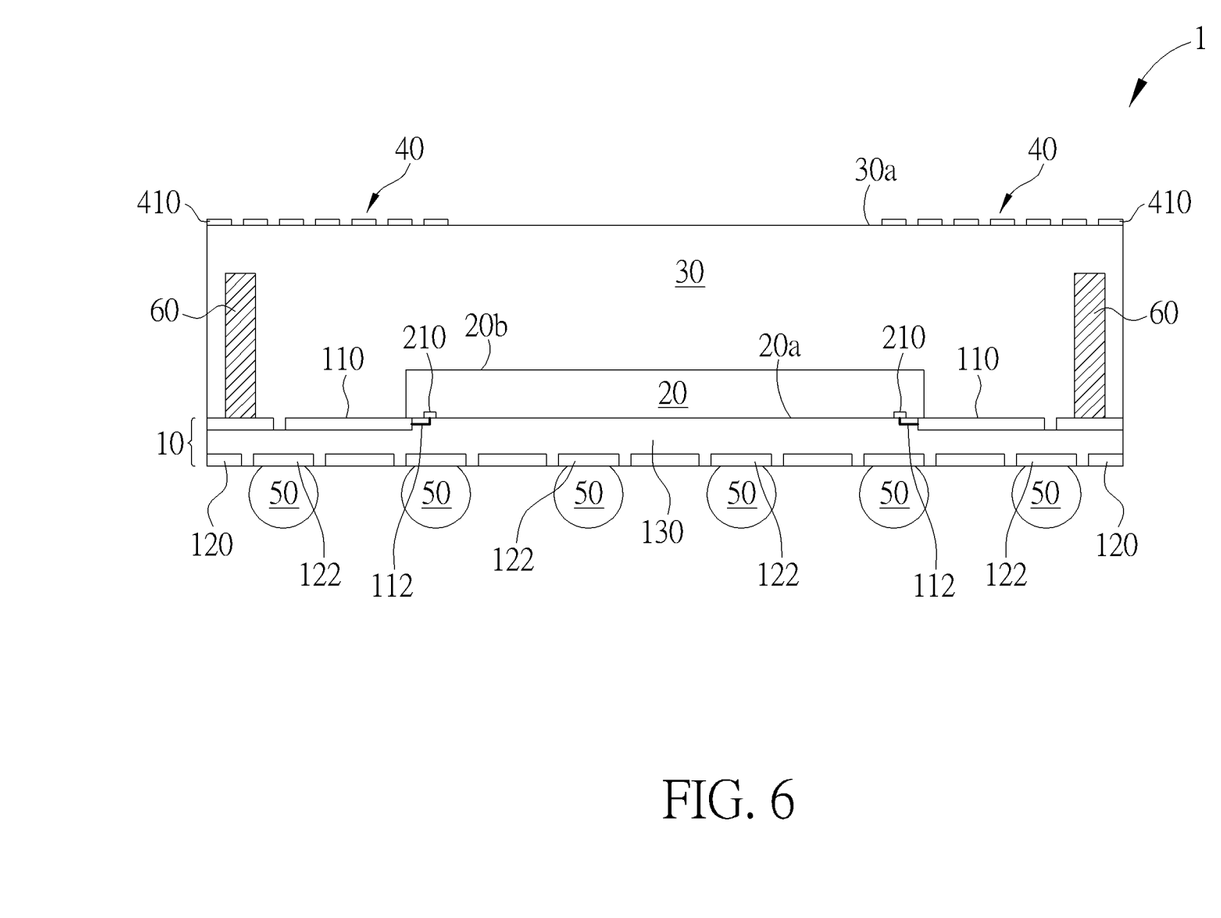
FIG. 6 to FIG. 8 shows some variations of an AiP with an FSS structure and supporting pillars according to various embodiments of the invention.
Figure 7:
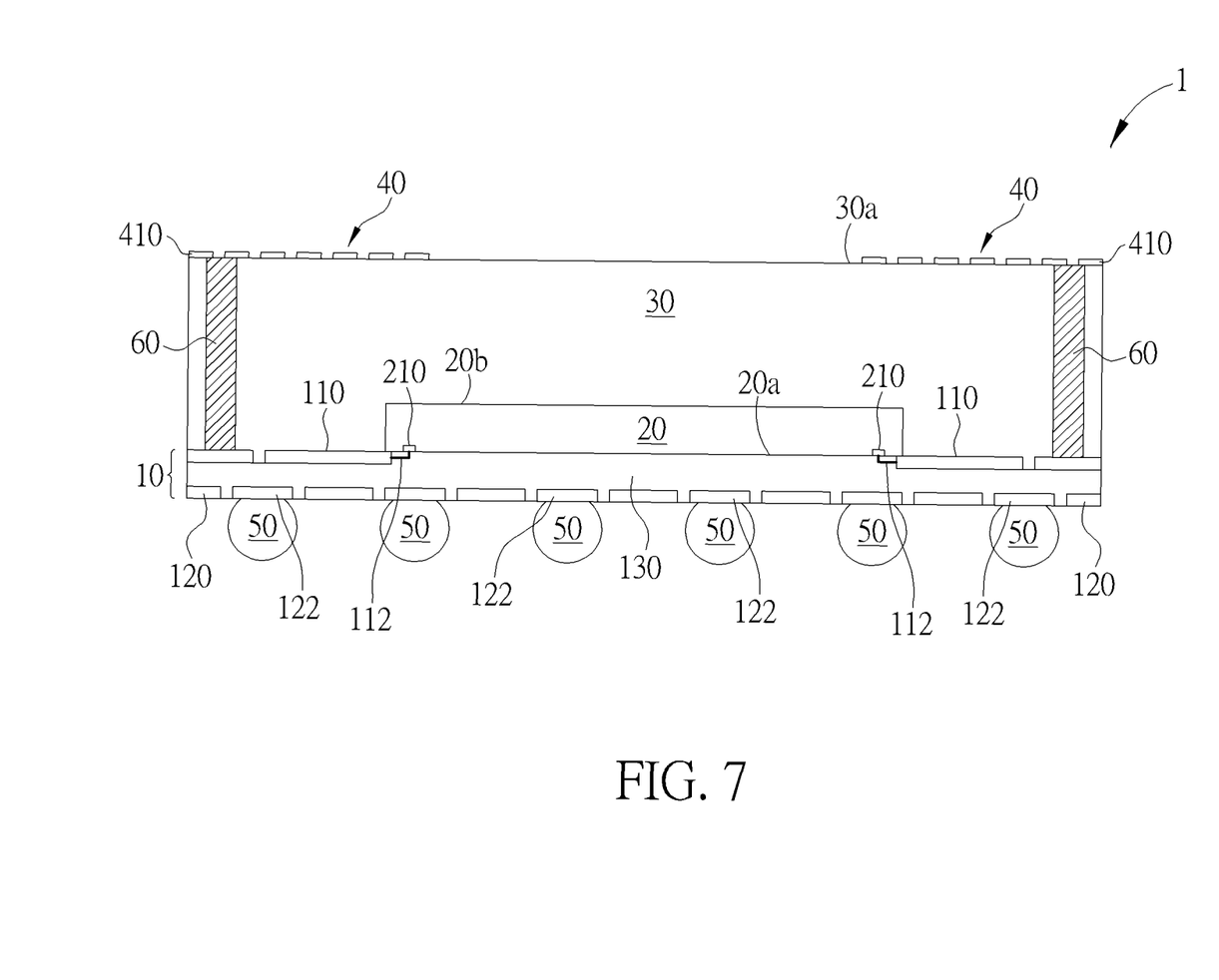
Figure 8:
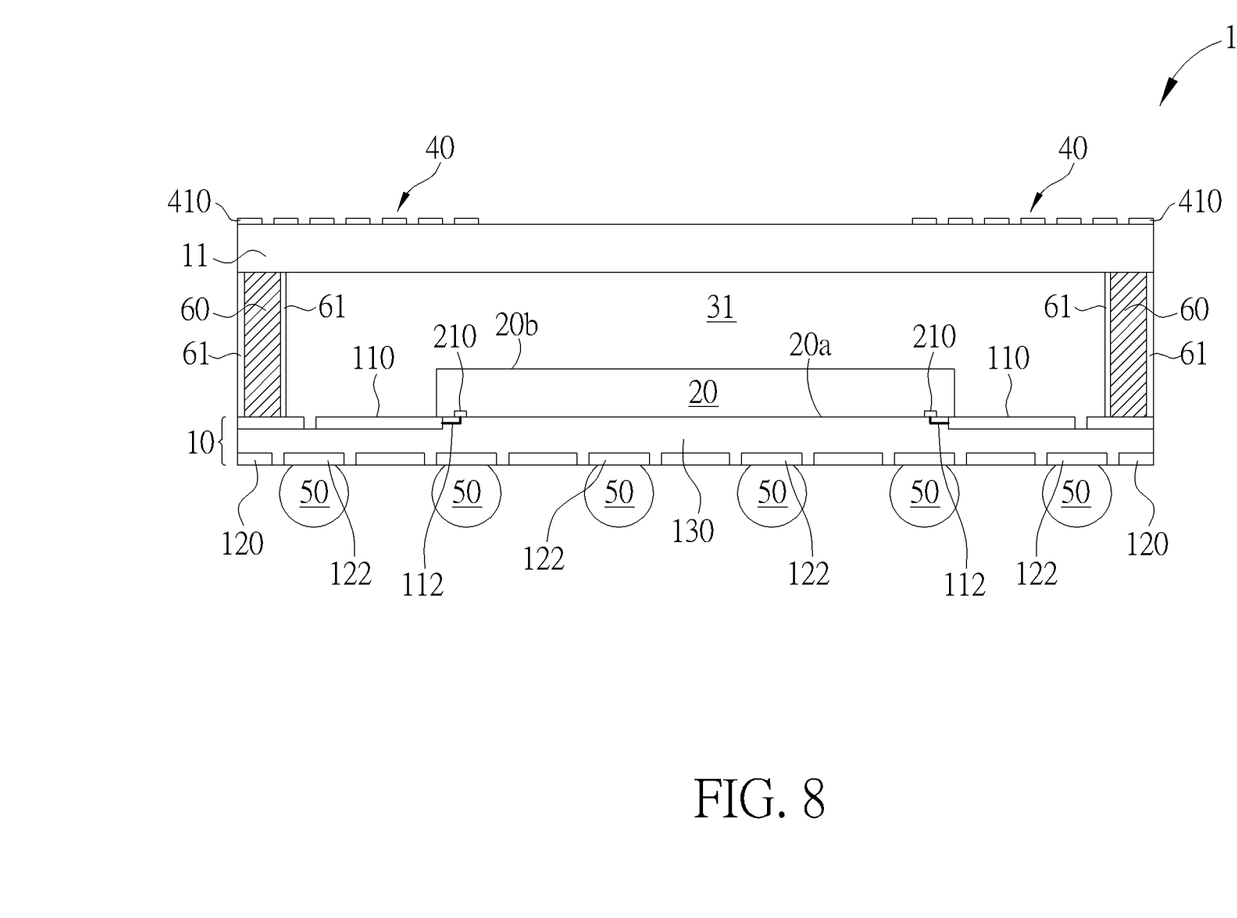

The mechanical and electrical performance of the above-described AiP structures may be further enhanced through an embedded pillar scheme. FIG. 6 to FIG. 8 shows some variations of an AiP with an FSS structure and supporting pillars according to various embodiments of the invention, wherein like numeral numbers designate like elements, regions or layers.

As shown in FIG. 6 and FIG. 7, a plurality of supporting pillars 60 may be provided in the encapsulation layer 30. In FIG. 6, the supporting pillars 60 may partially extend through the encapsulation layer 30. That is, the height of the pillars 60 is smaller than the thickness of the encapsulation layer 30. In FIG. 7, the supporting pillars 60 extend through the entire thickness of the encapsulation layer 30. That is, the height of the supporting pillars 60 is equal to the thickness of the encapsulation layer 30. The supporting pillars 60 can provide better mechanical control of thick encapsulation layer design and better control for antenna radiation pattern and gain.

As shown in FIG. 8, the encapsulation layer 30 may be spared and the supporting pillars 60 may be used to support the upper substrate 11 having the FSS structure 40 thereon. For example, the upper substrate 11 may be a glass, plastic or silicon substrate, but not limited thereto. By omitting the encapsulation layer 30, an air gap 31 may be formed between the upper substrate 11 and the substrate 10. The air gap 31 may further improve the gain of the antenna system. According to one embodiment of the invention, the sidewalls of the supporting pillars 60 may be coated with a protective layer 61. For example, the protective layer 61 may be an insulating layer 61, but not limited thereto.

The supporting pillars 60 may be of any material (e.g. metals) or shape and may be designed for better control of antenna radiation pattern and gain. The height of the supporting pillars 60 may be implemented based on mechanical and electrical requirements.

Figure 9:
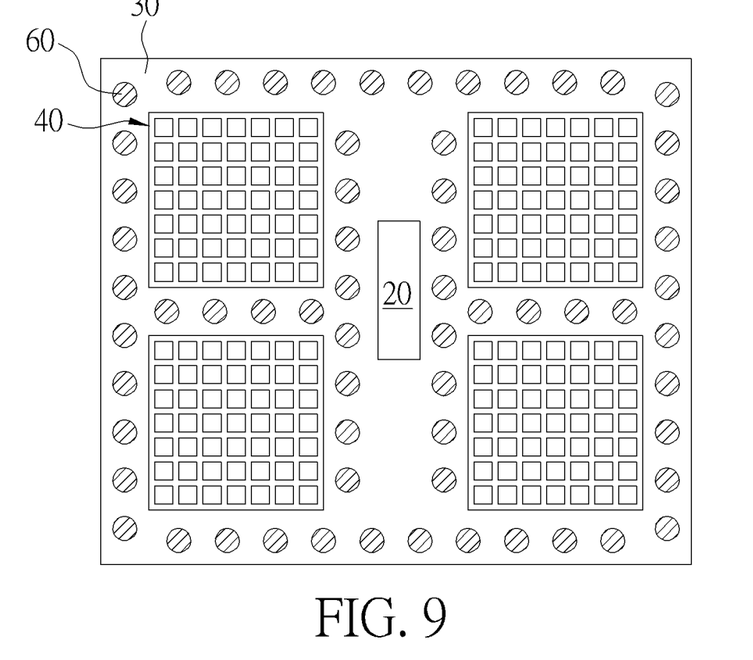
FIG. 9 to FIG. 12 are schematic top views showing the layouts of supporting pillars in the AiP according to embodiments of the invention.
Figure 10:
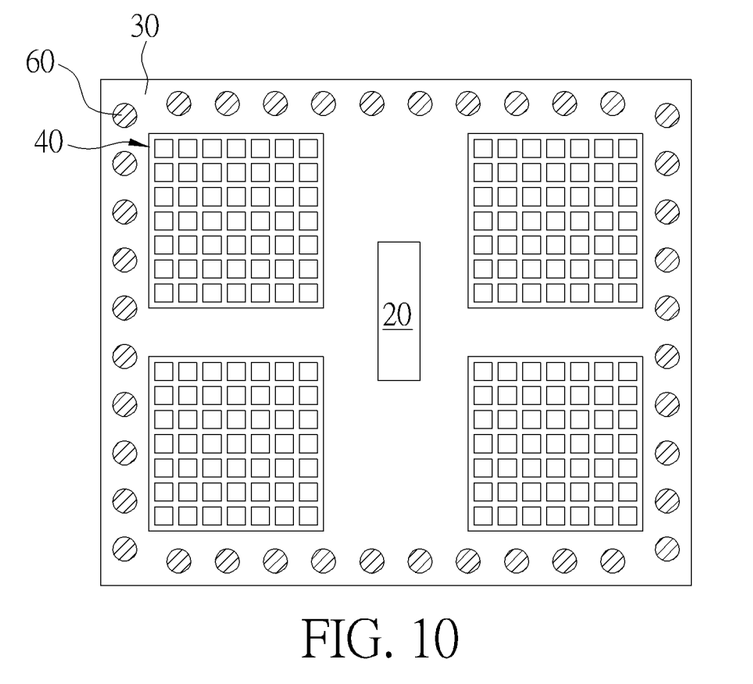
Figure 11:
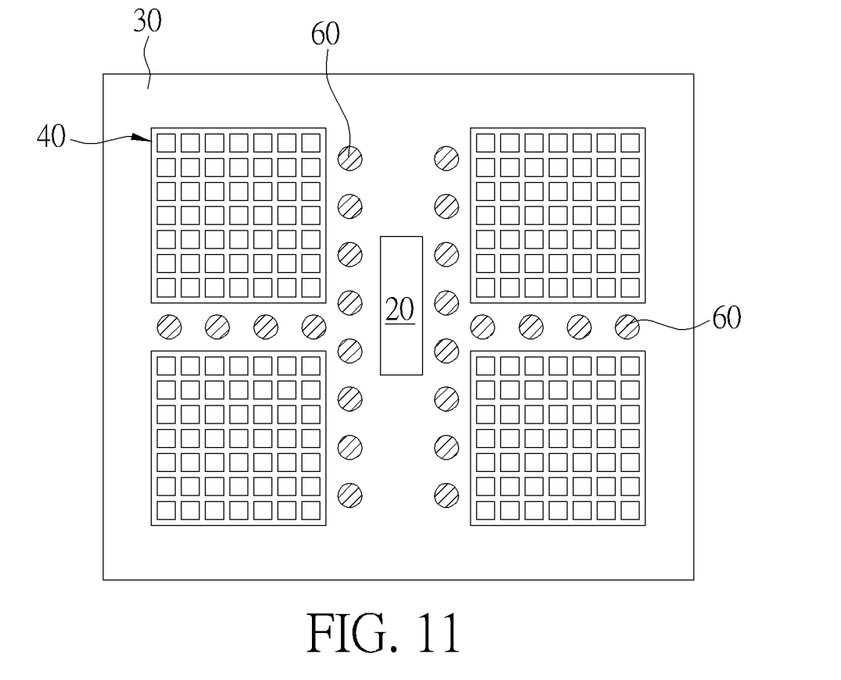
Figure 12:
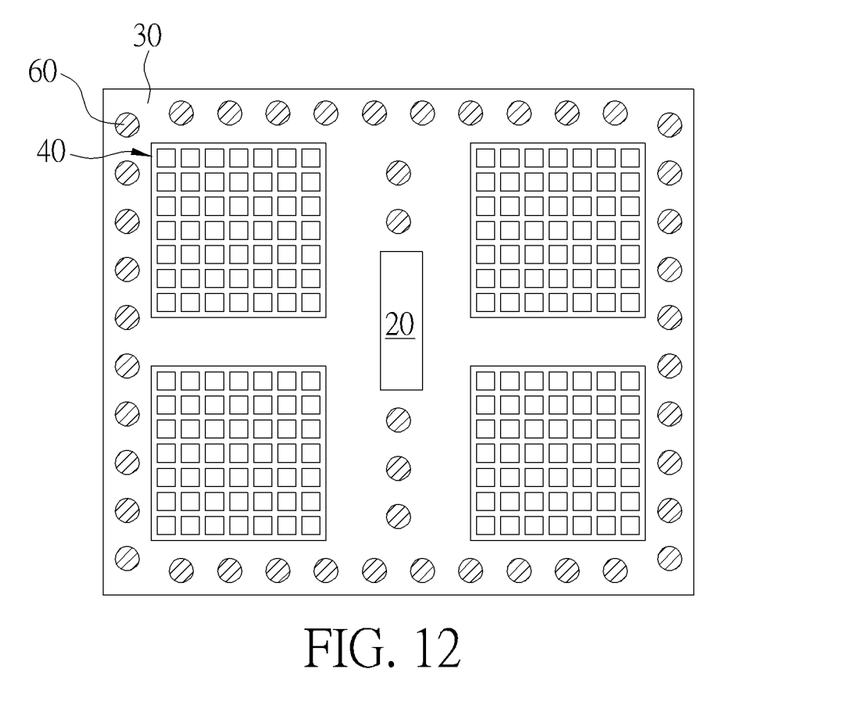

FIG. 9 to FIG. 12 are schematic top views showing the layouts of supporting pillars in the AiP according to embodiments of the invention, wherein like numeral numbers designate like elements, regions or layers. As shown in FIG. 9 to FIG. 12, the pillars 60 may surround the antenna layer 110 and the overlying coextensive FSS structure 40 in various ways. For example, as shown in FIG. 9, each of the FSS structures 40 is surrounded by the supporting pillars 60. As shown in FIG. 10, the supporting pillars 60 are only disposed along the perimeter of the AiP. As shown in FIG. 11, the supporting pillars 60 are only disposed at interval between the RF die 20 and the FSS structure 40, or at interval between two of the FSS structures. As shown in FIG. 12, the supporting pillars 60 are disposed along the perimeter of the AiP, and the support pillars 60 are also disposed at interval between two of the FSS structures.

Figure 13:
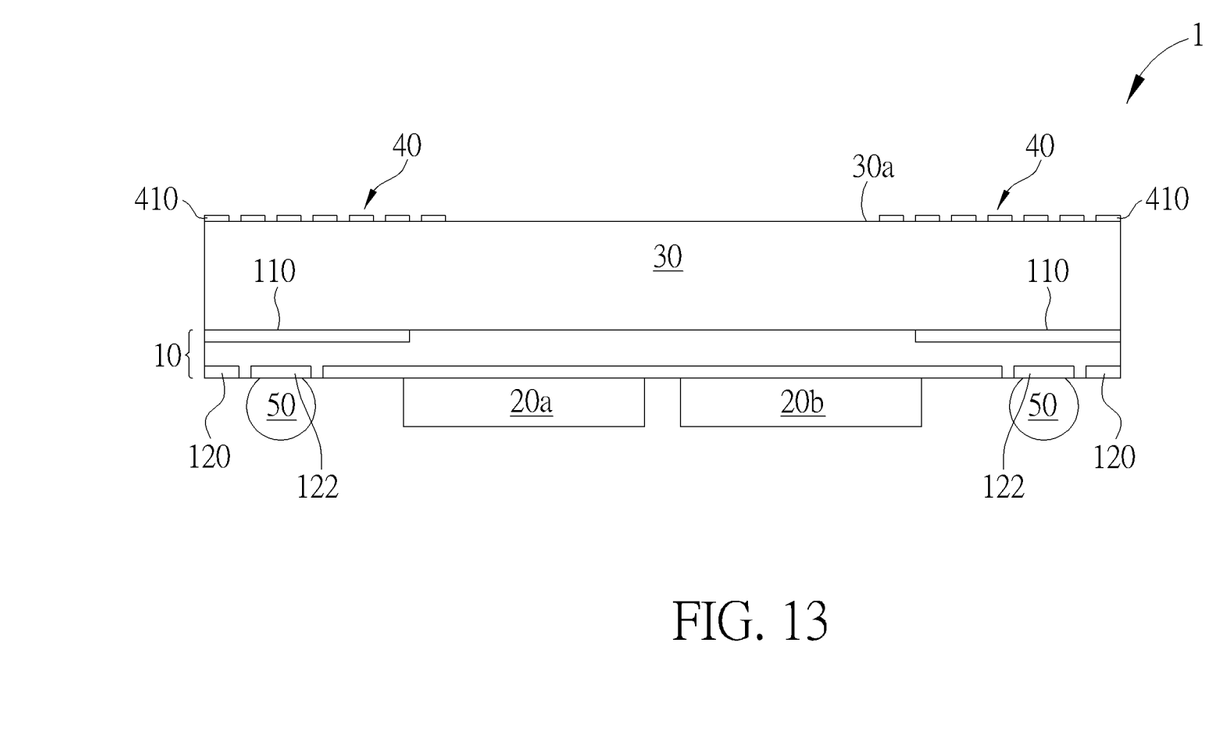
FIG. 13 and FIG. 14 are schematic, cross-sectional diagrams showing an AiP with an FSS structure and multiple dies according to various embodiments of the invention.
Figure 14:
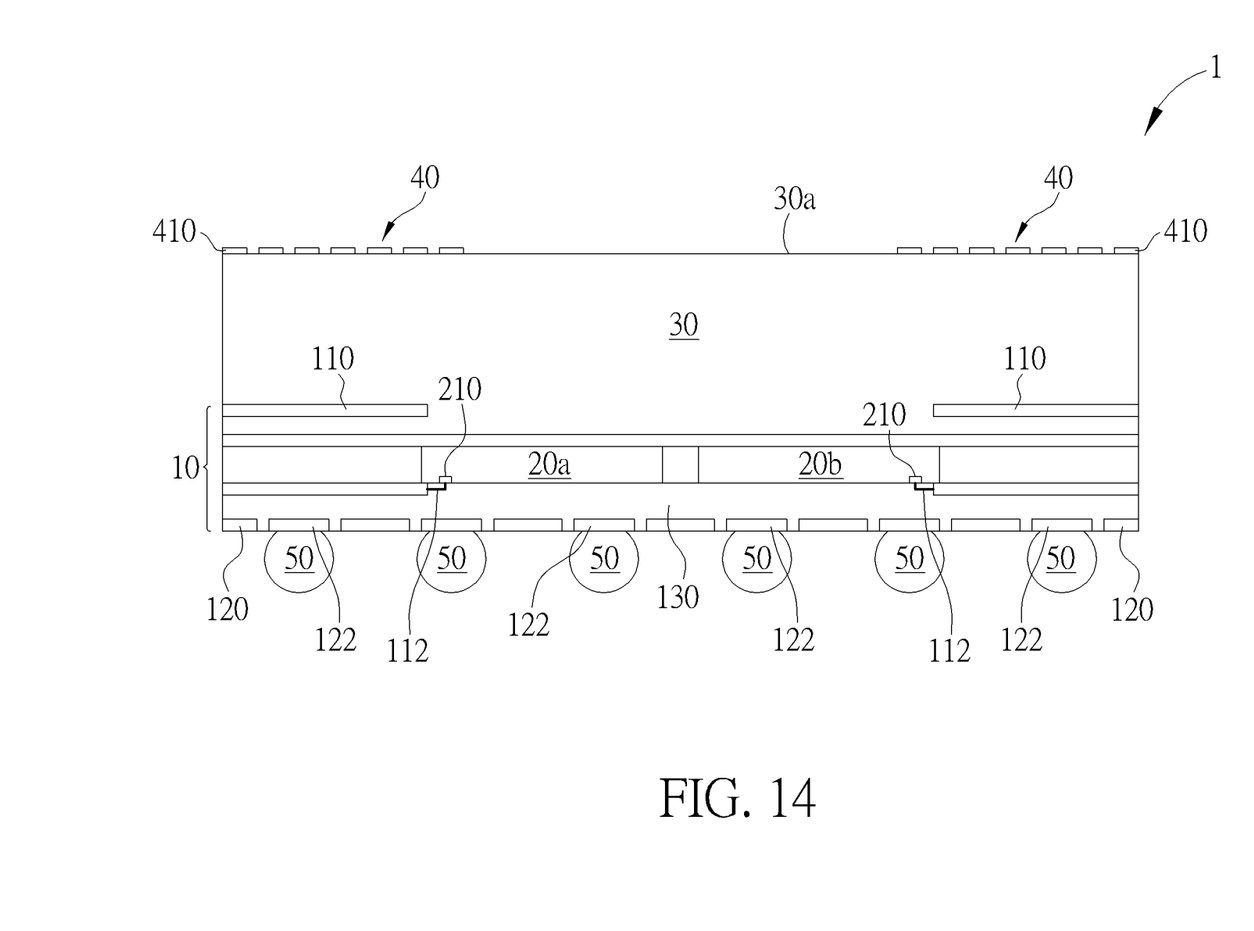

FIG. 13 and FIG. 14 are schematic, cross-sectional diagrams showing an AiP with an FSS structure and multiple chips according to various embodiments of the invention, wherein like numeral numbers designate like elements, regions or layers. As shown in FIG. 13, two semiconductor dies 20a and 20b may be mounted on the bottom surface of the substrate 10. As shown in FIG. 14, two semiconductor dies 20a and 20b may be embedded in the substrate 10 by the aforesaid SESUB technique. According to one embodiment of the invention, for example, the semiconductor die 20a may be an RF die and the semiconductor die 20b may be a digital processor die.

Figure 15:
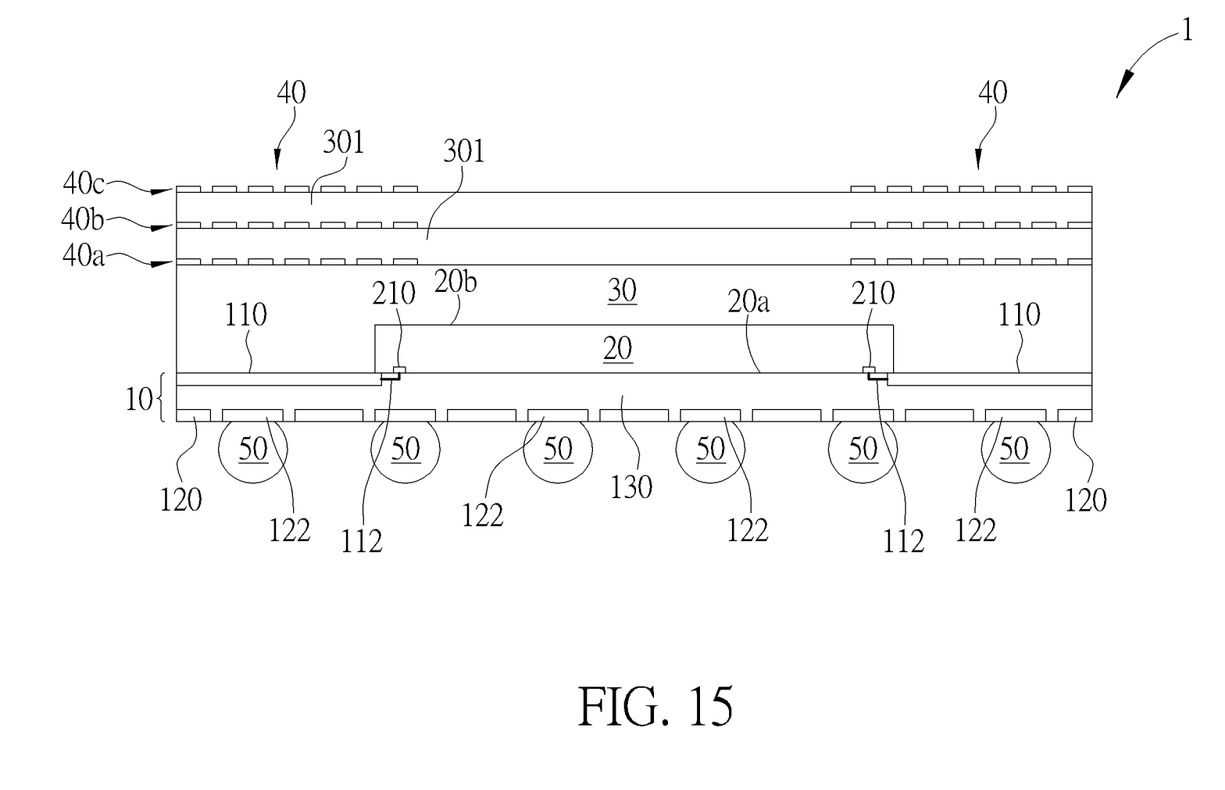
FIG. 15 is a schematic, cross-sectional diagram showing an AiP with a multi-layer FSS structure according to still another embodiment of the invention.

FIG. 15 is a schematic, cross-sectional diagram showing an AiP with a multi-layer FSS structure according to still another embodiment of the invention. As shown in FIG. 15, the difference between the AiP 1 in FIG. 15 and that in FIG. 2 is the FSS structure 40. The AiP 1 in FIG. 15 has a multi-layer FSS structure 40. For example, the multi-layer FSS structure 40 comprises a first-layer FSS structure 40a, a second-layer FSS structure 40b, and a third-layer FSS structure 40c stacked on one another. According to one embodiment of the invention, the periodic patterns of each of the first-layer FSS structure 40a, the second-layer FSS structure 40b, and the third-layer FSS structure 40c are aligned when views from the above. According to one embodiment of the invention, an insulating layer 301 such as a resin molding compound, an insulating coating, or RDL dielectric may be formed between the first-layer FSS structure 40a, the second-layer FSS structure 40b, and the third-layer FSS structure 40c. In one embodiment, the multi-layer FSS structure 40 could have various allocations. For example, the periodic patterns of each of the first-layer FSS structure 40a, the second-layer FSS structure 40b, and the third-layer FSS structure 40c could be different to each other, as to acquire higher bandwidth, or achieve dual-band function.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package, comprising:
    a substrate having thereon at least an antenna layer and a ground reflector layer under the antenna layer, wherein the at least an antenna layer is constructed from a metal layer of the substrate;
    a radio frequency (RF) die disposed on or in the substrate;
    an encapsulation layer disposed on the antenna layer of the substrate;
    a frequency-selective surface (FSS) structure disposed on the encapsulation layer; and
    a plurality of supporting pillars between the FSS structure and the substrate and extending through only a portion of the encapsulation layer,
    wherein the FSS structure is in direct contact with the encapsulation layer, and
    wherein top surfaces of the plurality of supporting pillars contact the encapsulation layer.

2. The semiconductor package according to claim 1, wherein the antenna layer is electrically connected to the RF die.

3. The semiconductor package according to claim 1, wherein the FSS structure comprises a two-dimensional periodic array of metal patterns of same shape and size.

4. The semiconductor package according to claim 3, wherein the two-dimensional periodic array of metal patterns has a fixed pitch.

5. The semiconductor package according to claim 1, wherein the FSS structure is disposed directly above and is aligned with the antenna layer.

6. The semiconductor package according to claim 1, wherein the FSS structure is disposed directly on a top surface of the encapsulation layer.

7. The semiconductor package according to claim 1, wherein the ground reflector layer is a metal layer.

8. The semiconductor package according to claim 1, wherein the semiconductor package is a fan-out wafer level package (FOWLP) and the substrate is a re-distribution layer (RDL) substrate.

9. The semiconductor package according to claim 1, wherein the semiconductor package is a flip-chip chip scale package (FCCSP) and the substrate is a packaging substrate.

10. The semiconductor package according to claim 1, wherein the semiconductor package is an embedded die package and the substrate is an organic laminate substrate.

11. The semiconductor package according to claim 10, wherein the RF die is embedded in the organic laminate substrate.

12. The semiconductor package according to claim 1 further comprising:
    a plurality of solder balls disposed on a bottom surface of the substrate.

13. The semiconductor package according to claim 1, wherein the plurality of supporting pillars surrounds the antenna layer and the FSS structure.

14. A semiconductor package, comprising:
    a substrate having thereon at least an antenna layer and a ground reflector layer under the antenna layer, wherein the at least an antenna layer is constructed from a metal layer of the substrate;
    a radio frequency (RF) die disposed on or in the substrate;
    a frequency-selective surface (FSS) structure disposed over the RF die, wherein the FSS structure is disposed directly above and is aligned with the antenna layer;
    an encapsulation layer disposed on the antenna layer of the substrate; and
    a plurality of supporting pillars between the FSS structure and the substrate and extending through only a portion of the encapsulation layer,
    wherein top surfaces of the plurality of supporting pillars contact the encapsulation layer.

15. The semiconductor package according to claim 14, wherein the antenna layer is electrically connected to the RF die.

16. The semiconductor package according to claim 14, wherein the FSS structure comprises a two-dimensional periodic array of metal patterns of same shape and size.

17. The semiconductor package according to claim 16, wherein the two-dimensional periodic array of metal patterns has a fixed pitch.

18. A semiconductor package, comprising:
    a substrate having thereon at least an antenna layer and a ground reflector layer under the antenna layer, wherein the at least an antenna layer is constructed from a metal layer of the substrate;
    a radio frequency (RF) die disposed on or in the substrate;
    a molding compound disposed on the antenna layer of the substrate; and
    a frequency-selective surface (FSS) structure disposed on the molding compound, wherein the FSS structure is disposed directly on a top surface of the molding compound, wherein the FSS structure is in direct contact with the molding compound; and a plurality of supporting pillars between the FSS structure and the substrate and extending through only a portion of the molding compound, wherein top surfaces of the plurality of supporting pillars contact the molding compound.

19. The semiconductor package according to claim 18, wherein the FSS structure comprises a two-dimensional periodic array of metal patterns of same shape and size.

20. The semiconductor package according to claim 19, wherein the two-dimensional periodic array of metal patterns has a fixed pitch.

* * * * *